(12) United States Patent
Glasser

(10) Patent No.: US 6,949,955 B2
(45) Date of Patent: Sep. 27, 2005

(54) SYNCHRONIZING SIGNALS BETWEEN CLOCK DOMAINS

(75) Inventor: Gabi Glasser, Talmon (IL)

(73) Assignee: Intel Corporation, Santa Clara, CA (US)

( * ) Notice: Subject to any disclaimer, the term of this patent is extended or adjusted under 35 U.S.C. 154(b) by 115 days.

(21) Appl. No.: 10/722,192

(22) Filed: Nov. 24, 2003

(65) Prior Publication Data

US 2005/0110524 A1 May 26, 2005

(51) Int. Cl.[7] .............................................. H03K 19/00
(52) U.S. Cl. ............................ 326/93; 326/46; 326/94
(58) Field of Search ............................... 326/37, 38, 46, 326/93–98

(56) References Cited

U.S. PATENT DOCUMENTS

| | | | | | |
|---|---|---|---|---|---|
| 5,781,765 | A | * | 7/1998 | Alexander | 713/400 |
| 5,793,227 | A | * | 8/1998 | Goldrian | 326/94 |
| 5,857,005 | A | * | 1/1999 | Buckenmaier | 375/357 |
| 6,112,307 | A | * | 8/2000 | Ajanovic et al. | 713/400 |
| 6,345,328 | B1 | * | 2/2002 | Rozario et al. | 710/52 |
| 6,516,362 | B1 | * | 2/2003 | Magro et al. | 710/58 |
| 6,519,301 | B1 | * | 2/2003 | Rowell | 375/354 |
| 6,571,106 | B1 | * | 5/2003 | Li | 709/208 |
| 6,711,089 | B2 | * | 3/2004 | Ong | 365/233 |
| 6,721,277 | B1 | * | 4/2004 | Yu et al. | 370/251 |

* cited by examiner

Primary Examiner—Don Le
(74) Attorney, Agent, or Firm—Kacvinsky LLC

(57) ABSTRACT

A method and apparatus to synchronize signals between different clock domains are described.

22 Claims, 6 Drawing Sheets

SYNCHRONIZING SIGNALS BETWEEN CLOCK DOMAINS

BACKGROUND

A communication system may need to transfer information between different clock domains. A transfer typically requires one or more signals to be synchronized between the clock domains. Reductions in synchronization times may result in higher system performance. Consequently, there may be need for improvements in such techniques in a device or network.

BRIEF DESCRIPTION OF THE DRAWINGS

The subject matter regarded as the embodiments is particularly pointed out and distinctly claimed in the concluding portion of the specification. The embodiments, however, both as to organization and method of operation, together with objects, features, and advantages thereof, may best be understood by reference to the following detailed description when read with the accompanying drawings in which:

DETAILED DESCRIPTION

The embodiments relate to electronic circuits. More specifically, the embodiments relate to logic data transfer across asynchronous clock domains. The embodiments may provide a synchronization circuit that is capable of reducing the synchronization time ($T_{sync}$) when transferring data from a fast clock domain (cycle time=$T_{fast}$) to a slow clock domain (cycle time=$T_{slow}$). In one embodiment, for example, the synchronization time may be reduced from 2 $T_{slow} < T_{sync} \leq 3$ $T_{slow}$ to 0 $T_{slow} < T_{sync} < 1$ $T_{slow}$. It may be appreciated that 0 $T_{slow} = T_{sync}$ means that the synchronization operation did not add any additional latency. Reducing synchronization times may increase system performance, such as increasing data throughput, adding additional data analysis functionality, decreasing resource requirements such as memory, and so forth.

The embodiments attempt to provide an improved method and apparatus for asynchronously transferring data between synchronous sequential logic circuits belonging to different clock domains. In one embodiment, a control signal may be generated from a first logic circuit operating in a first clock domain. The control signal may be sent to a second logic circuit operating in a second clock domain. The control signal may be synchronized from the first clock domain to the second clock domain using a predetermined time slot.

Numerous specific details may be set forth herein to provide a thorough understanding of the embodiments of the invention. It will be understood by those skilled in the art, however, that the embodiments of the invention may be practiced without these specific details. In other instances, well-known methods, procedures, components and circuits have not been described in detail so as not to obscure the embodiments of the invention. It can be appreciated that the specific structural and functional details disclosed herein may be representative and do not necessarily limit the scope of the invention.

It is worthy to note that any reference in the specification to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Figure 1:
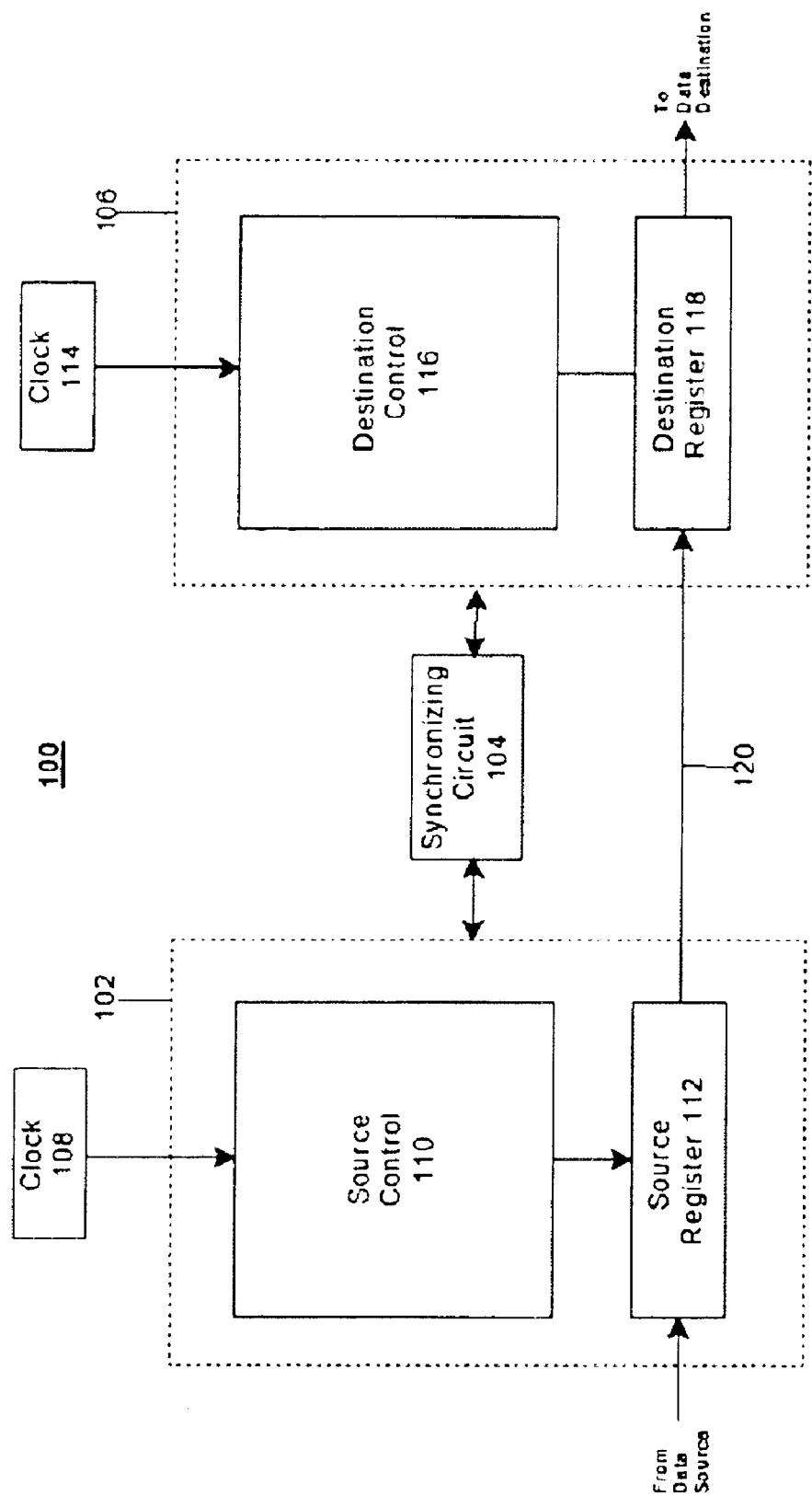
FIG. 1 illustrates a circuit suitable for practicing one embodiment.

Referring now in detail to the drawings wherein like parts are designated by like reference numerals throughout, there is illustrated in FIG. 1 a system suitable for practicing one embodiment. FIG. 1 is a block diagram of a circuit 100. In one embodiment, circuit 100 may comprise part of a communication system. For example, circuit 100 may be implemented as part of a network node. The term "network node" as used herein may refer to any node capable of communicating information over a communication medium in accordance with one or more protocols. Examples of network nodes may include a computer, server, switch, router, bridge, gateway, personal digital assistant, mobile device, call terminal and so forth. The term "protocol" as used herein may refer to a set of instructions to control how the information is communicated over the communications medium. The term "communications medium" as used herein may refer to any medium capable of carrying information signals. Examples of communications mediums may include metal leads, semiconductor material, twisted-pair wire, co-axial cable, fiber optic, RF spectrum, and so forth. The terms "connection" or "interconnection," and variations thereof, in this context may refer to physical connections and/or logical connections.

In one embodiment, for example, the network node may be connected by communications mediums comprising RF spectrum for a wireless network, such as a cellular or mobile system. In this case, the network node may further comprise the devices and interfaces to convert the signals carried from a wired communications medium to RF signals. Examples of such devices and interfaces may include omni-directional antennas and wireless RF transceivers. The embodiments are not limited in this context.

In one embodiment, for example, the network node may comprise part of a local area network (LAN) operating in accordance with one or more Ethernet based communication protocols as defined by the Institute for Electrical and Electronic Engineers (IEEE) 802.3 series of standards, such as a Gigabit Ethernet 1000Base-T communication system ("Gigabit Ethernet"), an advanced 10GBase-T communication system, and so forth. The network node, for example, may comprise processing systems having Gigabit Ethernet device(s). The Gigabit Ethernet devices may be implemented as part of a network interface card (NIC), for example. Although one embodiment may be illustrated in the context of a Gigabit Ethernet device by way of example, it can be appreciated that the embodiments may be implemented in any type of communication device.

Referring again to FIG. 1, in one embodiment circuit 100 may comprise a sequential logic circuit 102 and a sequential logic circuit 106, both connected by a synchronization circuit 104. Although synchronization circuit 104 may be shown synchronizing signals between two logic circuits for purposes of illustration, it may be appreciated that synchronizing circuit 104 may synchronize signals communicated between more than two logic circuits using the principles described herein. Further, although synchronization circuit 104 is shown as a separate circuit, it may be appreciated that synchronization circuit 104 may be combined with other circuits in circuit 100 and still fall within the scope of the embodiments.

In one embodiment, circuit 100 may comprise a pair of sequential logic circuits. Sequential logic circuits may comprise one or more memory elements. Examples of a memory element may include flip flops, registers, and so forth. The memory elements may maintain state information, such as one or more values and combinational logic. The output of a memory element is typically a function of its inputs and contents, with the contents representing the present state of the memory element.

In one embodiment, sequential logic circuits 102 and 106 may comprise synchronous or clocked circuits. While inputs to an asynchronous sequential logic circuit may change at any time, the inputs to a synchronous logic circuit may change the state at specific times as defined by clocking or timing methodology. Synchronous sequential circuits are triggered to change state according to a clock signal received or generated by the circuit. As the output of a memory element is a signal representing the current state of the memory element, the output of a clock sequential circuit is updated in synchronization with clock policies provided as input to the circuit or generated by the circuit.

In one embodiment, sequential logic circuit 102 may receive a first clock signal from a clock 108. Sequential logic circuit 106 may receive a second clock signal from a clock 114. The first clock signal and the second clock signal may operate at different frequencies. In one embodiment, the first clock signal may operate at a higher frequency than the second clock signal. For example, the first clock signal may operate at a frequency of 1 GigaHertz (GHz), while the second clock signal may operate at a frequency of 128 MegaHertz (MHz). It may be appreciated that these frequency values are used by way of illustration only. The embodiments are not limited in this context.

In one embodiment, the sequential logic circuits may use a timing methodology such as edge-trigger clocking. A memory element may be triggered during either the leading (e.g., rising) or trailing (e.g., falling) edge of a clock signal supplied as input to the memory element. The term "triggered" as used herein may refer to sampling one or more inputs to the memory element. For example, a trailing edge trigger flip flop changes state on the trailing edge of a clock signal in transition and maintains that state for one complete clock cycle, until another trailing edge of a clock signal is detected.

When a memory element such as a flip-flop or register is triggered by the edge of a clock signal, the input signals to the memory element need to be stable at that time. If one or more input signals to a memory element are changing state at a time at which the clock edge is received, the state and thus the output of the memory element may be unstable. When one or more inputs of a memory element are in transition at the time the memory element is triggered, thereby causing the state and output to be indeterminate, the memory element is considered to be in a "metastable" state. Metastability may manifest itself in many ways, such as an unpredictable output logic value, oscillation of the output value, indeterminate voltage level of the output representing an illegitimate logic value somewhere between a high or low logic value, an indeterminate period of instability, and so forth.

A memory element may implement various fundamental timing requirements in an attempt to reduce metastability. One such timing requirement may be referred to as a "set up time." The set up time may define the period of time immediately prior to receiving a clock edge during which inputs to the memory element need to be stable and valid. Another timing requirement may be referred to as a "hold time." The hold time may define the period of time immediately following reception of a clock edge during which inputs to the memory element must be stable and valid. Metastability is the resulting behavior of a synchronous element if the fundamental timing requirements are not met. Consequently, each input to a synchronous element needs to be stable. The term "stable" as used herein may refer to maintaining a voltage level representing a valid logic value so that a single valid output logic value is detected for a window of time equal to the set up time plus the hold time.

In one embodiment, sequential logic circuits 102 and 106 may utilize different clocks, such as clocks 108 and 114, respectively. As a result, sequential logic circuits 102 and 106 may represent different clock domains. As referred to herein, components of a synchronous logic circuit which derive their clock source from the same clock are considered to be in the same clock domain. By way of contrast, components of synchronous logic circuits which derive their clock source from different independent clocks, such as circuit 100, are considered to be in different clock domains.

Signals communicated between sequential logic circuits operating in different clock domains may be transferred asynchronously. An example of a communicated signal may comprise a control signal. As a result, it may be possible that a signal transferred from sequential logic circuit 102 will be in transition at the same time a clock signal for sequential logic circuit 106 triggers the memory element that receives as input the signal from sequential logic circuit 102. This may cause metastability.

In one embodiment, circuit 100 may implement synchronization circuit 104 to synchronize signals communicated between the different clock domains of sequential logic circuits 102 and 106 to reduce the above stated problems, as well as others. For example, synchronization circuit 104 may synchronize an asynchronous signal sent from sequential logic circuit 102 with the clock domain of sequential logic circuit 106. This may reduce or prevent the communicated asynchronous signal from being in transition during a triggering of sequential logic circuit 106, thereby reducing the occurrence of metastability.

In general operation, source register 112 may receive and store data from a data source (not shown). Source register 112 may be of any length. For example, in one embodiment source register 112 may comprise a 32-bit shift register. Once source register 112 is full, the stored data may be transferred over a data bus, such as data bus 120. Since destination register 118 by itself does not know when source register 112 has data available for transfer over bus 120, source control 110 may send a control signal (e.g., DATA_VALID) to destination control 116 to furnish this information. When asserted, the control signal may inform destination control logic 116 when source register 112 has data available and is ready to transmit. Source control logic 110 ensures that the contents of source register 112 do not change after the DATA_VALID signal is asserted until after the DATA_VALID signal has been synchronized to the clock domain of sequential logic circuit 106, and data transfer has been successfully completed from source register 112 to destination register 118.

Synchronization circuit 104 may receive the DATA_VALID signal and synchronize the DATA_VALID signal to the clock domain of sequential logic circuit 106. After the DATA_VALID signal is synchronized, the 32-bit data bus 120 may be latched on the rising edge of the clock signal from clock 114, in accordance with a synchronization indication given by synchronizing circuit 104 to source control 110 and/or destination control 116. Once the synchronization indication has been given, the data may be transferred between source register 112 and destination register 118. Synchronization circuit 104 may be further described with reference to FIG. 2.

Figure 2:
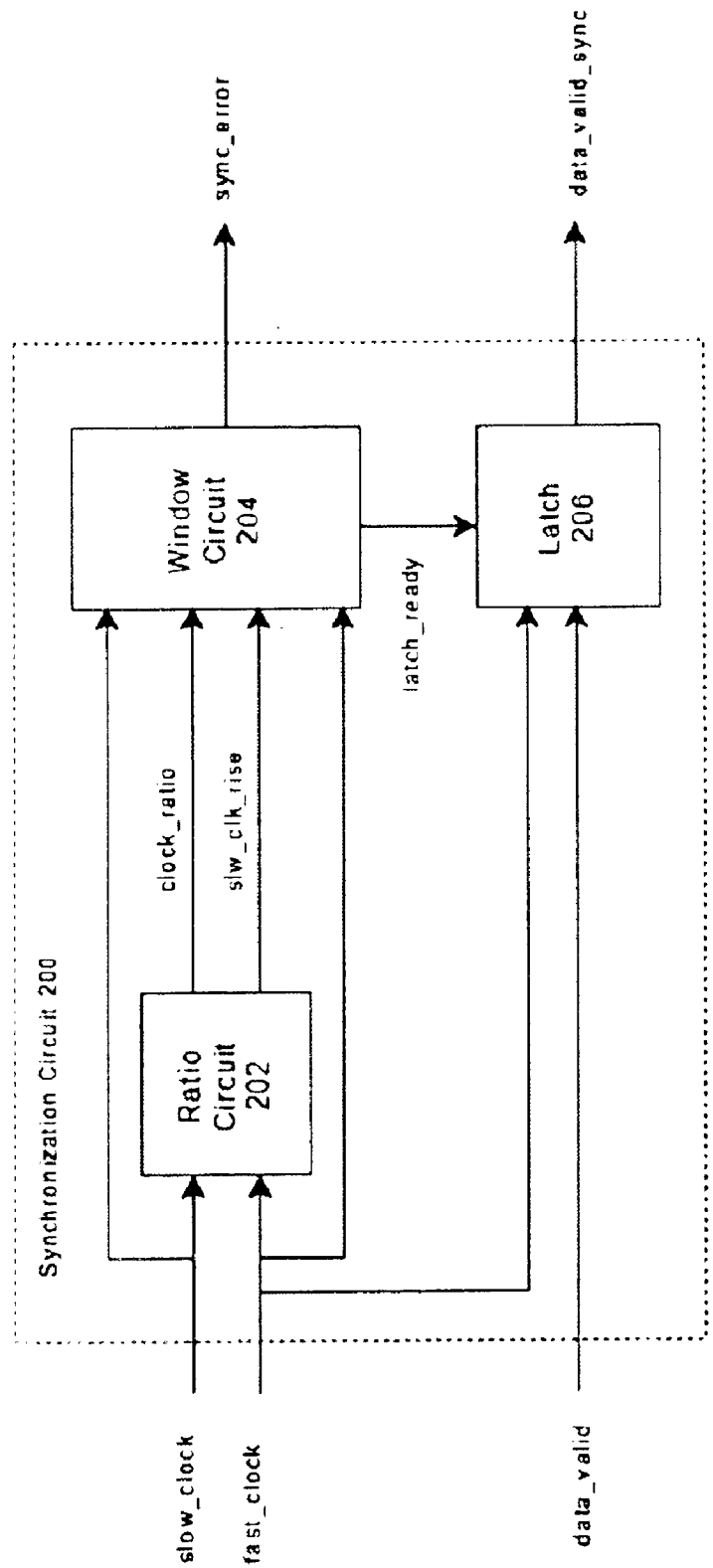
FIG. 2 illustrates a synchronization circuit in accordance with one embodiment.

FIG. 2 illustrates a synchronization circuit in accordance with one embodiment. FIG. 2 illustrates a synchronization circuit 200. Synchronization circuit 200 may be representative of, for example, synchronization circuit 104. In one embodiment, synchronization circuit may comprise a ratio circuit 202, a window circuit 204 and a latch 206. Although synchronization circuit 200 may comprise several components for purposes of illustration, it may be appreciated that the number of components may be modified while still performing the functionality described herein.

In one embodiment, ratio circuit 202 may receive as input the first clock signal as represented by a FAST_CLOCK signal, and the second clock signal as represented by a SLOW_CLOCK signal. Ratio circuit 202 sources the SLOW_CLOCK signal as a data signal and synchronizes it to the FAST_CLOCK signal. This may be accomplished, for example, using a series of two flip-flops clocked by the FAST_CLOCK signal, often referred to as a "synchronizer chain." The flip-flops may be coupled in sequence, with the input to the first flip-flop being coupled to the SLOW_CLOCK signal, and the output of the first flip-flop being coupled to the input of the second flip-flop. The embodiments are not limited in this context.

In addition to synchronizing the SLOW_CLOCK signal with the FAST_CLOCK signal, ratio circuit 202 may also determine the rising edge of the synchronized SLOW_CLOCK signal, and assert a corresponding SLW_CLK_RISE signal to indicate the rising edge. The delay for synchronizing the SLOW_CLOCK to the FAST_CLOCK signal may vary according to a given implementation. The synchronization delay may therefore be known and used by other circuits, such as window circuit 204, as discussed further below. For example, the synchronization delay at this stage may consume 2–3 fast clock cycles. Ratio circuit 202 may also calculate a clock ratio between the two clock signals. For example, if the FAST_CLOCK signal is operating at 1 GHz, and the SLOW_CLOCK signal is operating at 128 MHz, then the clock ratio may comprise 1:7, when referring to the clock ratio value as an integer. It can be appreciated, however, that the clock ratio value may also be handled as a non-integer number, such as a floating point number. Ratio circuit 202 may output a CLOCK_RATIO signal to represent the clock ratio determination.

In one embodiment, window circuit 204 may receive as inputs the FAST_CLOCK signal, the SLOW_CLOCK signal, the CLOCK_RATIO signal, and the SLW_CLK_RISE signal. Window circuit 204 may use these signals to determine a time slot to synchronize the DATA_VALID signal to the SLOW_CLOCK signal. In one embodiment, the time between the rising edges (i.e., clock phases) of the two clocks may be taken into account to determine the time slot to perform synchronization. For example, the time slot may comprise a time interval between the rising edges of the SLOW_CLOCK signal. The time interval may vary according to a given implementation, but should have sufficient length to allow the appropriate set up time and hold time needed to read the data in the slow clock domain.

In one embodiment, the time slot may be a predetermined time slot. The term "predetermined time slot" as used herein may refer to determining the time slot prior to receiving a control signal to be synchronized with the receiving clock domain. Once the time slot has been determined, one or more signals may be synchronized during a given time slot. By identifying the appropriate time slot prior to arrival of the signal to be synchronized, the synchronization time may be significantly reduced. For example, in one embodiment the synchronization time may be reduced to a maximum 1 cycle of the SLOW_CLOCK signal (e.g., one 128 MHz cycle). Further, the time slot assures the signal will be stable when the flops in the slower clock domain latch the signal value. The time slot may be described in further detail later with reference to FIG. 6.

In one embodiment, window circuit 204 may receive as input the CLOCK_RATIO signal, the SLW_CLK_RISE signal and the slow clock synchronization delay. Window circuit 204 may use these inputs to generate an output signal LATCH_READY to indicate the start or end time for a given time slot. The LATCH_READY signal may be used to synchronize the DATA_VALID signal to the SLOW_CLOCK signal. The LATCH_READY signal should be given the value of "1" for at least 1 fast clock cycle. The LATCH_READY signal should have a value of "0" before the set up time of the element driven by the SLOW_CLOCK and the DATA_VALID signals. Window circuit 204 may also be configured to generate a SYNC_ERROR signal to detect errors by synchronization circuit 200, such as indicating a clock domain failed to reach a minimum clock ratio, for example.

In one embodiment, a latch 206 may receive as inputs the LATCH_READY signal from window circuit 204, the FAST_CLOCK signal, and the DATA_VALID signal from sequential logic circuit 102. In one embodiment, latch 206 may be a D flip-flop. Flip-flop 206 clocked by the FAST_CLOCK signal with an enable pin may latch the DATA_VALID signal that is going to be synchronized. The LATCH_READY signal is connected to the enable pin of flip-flop 206. Flip-flop 206 may output a signal DATA_VALID_SYNC that is now synchronized to the SLOW_CLOCK signal. In one embodiment, the synchronization time between receiving the DATA_VALID signal and generating the DATA_VALID_SYNC signal may comprise 0-1 cycles of the slow clock signal.

Synchronization circuit 200 may also reduce the concerns associated with implementing a particular Mean Time Between Failures (MTBF) value. The MTBF value may represent a design parameter to indicate the time between the anticipated failure of a component. For example, the MTBF value for a switch may be 20 years, meaning that the switch may enter into an anticipated failure condition every 20 years of operation. In one embodiment, the MTBF value may be limited to account for the synchronization of the slow clock signal that is input to synchronization circuit 200. In conventional synchronization techniques, such as using a synchronizer chain having a depth of two or more flip-flops, every signal that is synchronized reduces the MTBF value. By way of contrast, a single time slot for synchronization circuit 200 may be used to synchronize a plurality of signals without reducing the MTBF value.

The operations of circuits 100 and 200 may be further described with reference to FIGS. 3–5 and accompanying examples. Although one or more figures as presented herein may include a particular programming logic, it can be appreciated that the programming logic merely provides an example of how the general functionality described herein can be implemented. Further, the given programming logic does not necessarily have to be executed in the order presented unless otherwise indicated. In addition, although the given programming logic may be described herein as being implemented in the above-referenced modules, it can be appreciated that the programming logic may be implemented anywhere within the system and still fall within the scope of the embodiments.

Figure 3:
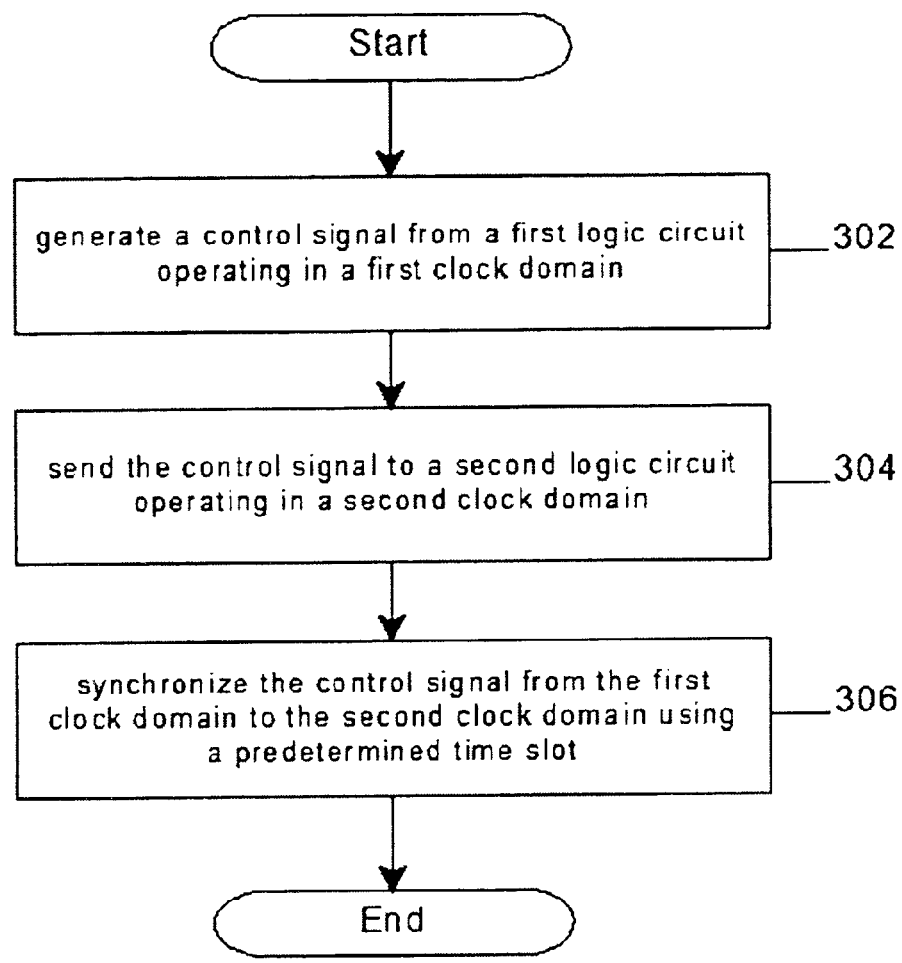
FIG. 3 is a block flow diagram of the programming logic performed by a synchronization circuit in accordance with one embodiment.

FIG. 3 illustrates a programming logic for the operation of a synchronization circuit in accordance with one embodiment. As shown in programming logic 300, a control signal may be generated from a first logic circuit operating in a first clock domain at block 302. The control signal may be sent to a second logic circuit operating in a second clock domain at block 304. The control signal may be synchronized from the first clock domain to the second clock domain using a predetermined time slot at block 306.

In one embodiment, the first clock domain may use a first clock signal operating at a first frequency. The second clock domain may use a second clock signal operating at a second frequency. In one embodiment, the first frequency may be higher than the second frequency.

In one embodiment, the synchronization at block 306 may be performed by receiving the first and second clock signals at a synchronization circuit. A ratio circuit for the synchronization circuit may synchronize the first and second clock signals in accordance with a synchronization delay value. The ratio circuit may determine a clock ratio value between the first and second clock signals. The ratio circuit may generate a rising edge indicator for the second clock signal. A window circuit may receive each of these signals and/or values, and use them to determine the time slot. The window circuit may generate a latch ready signal during the time slot. The latch ready signal may be asserted to indicate a start time for the time slot, and remains asserted for a time interval of at least one cycle of the first clock signal. The start time may comprise, for example, at least one clock cycle of the first clock signal prior to the set up time of the element clocked by the second clock signal. Once the control signal is synchronized, information may be transferred from the first logic circuit to the second logic circuit.

Figure 4:
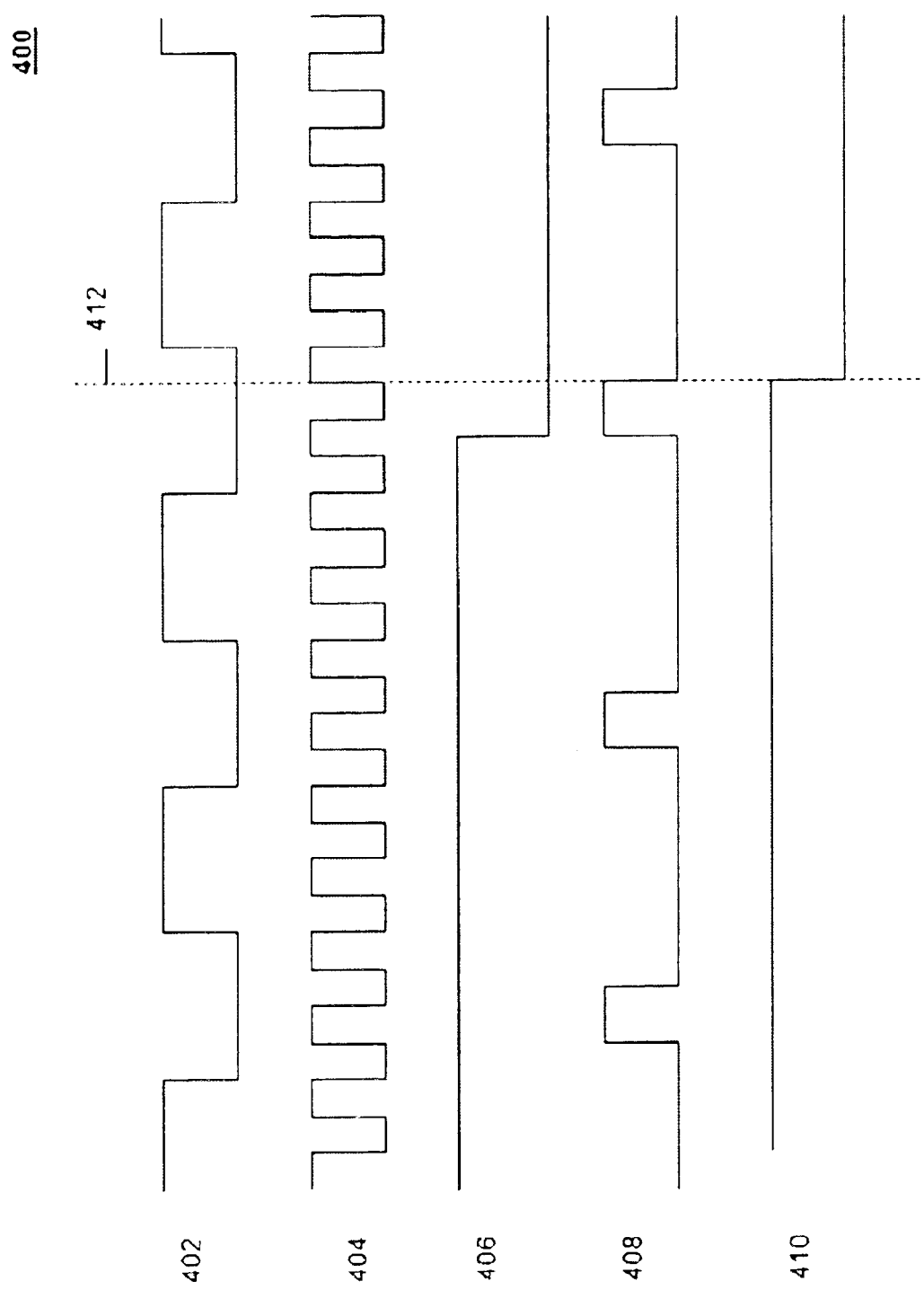
FIG. 4 illustrates a first set of waveform diagrams representing various signals in accordance with one embodiment.

FIG. 4 illustrates a first set of waveform diagrams representing various signals in accordance with one embodiment. FIG. 4 illustrates a set of waveform diagrams 400. Waveform 402 represents the slow clock signal. Waveform 404 represents the fast clock signal. In this example, the cycle time of the signal in waveform 402 may comprise 4.5 nanoseconds (ns), while the cycle time of the signal in waveform 404 may comprise 1 ns. Waveform 406 may represent a signal to be synchronized from the fast clock signal to the slow clock signal. As shown in FIG. 4, waveform 406 may change on the rise of the fast clock signal of waveform 404. Waveform 408 represents the latch ready signal from window circuit 204, for example.

Waveform 410 represents the synchronized signal from latch 406, for example. Waveform 410 changes one full cycle of the fast clock signal of waveform 404 before the rise of the slow clock signal of waveform 402. This lets the synchronic element clocked by the slow clock signal to read the new value at the next rise of the slow clock signal. In one embodiment, this may occur at approximately 2 ns, as compared to the conventional synchronizer chain technique which may take approximately 11 ns to synchronize the signal.

Figure 5:
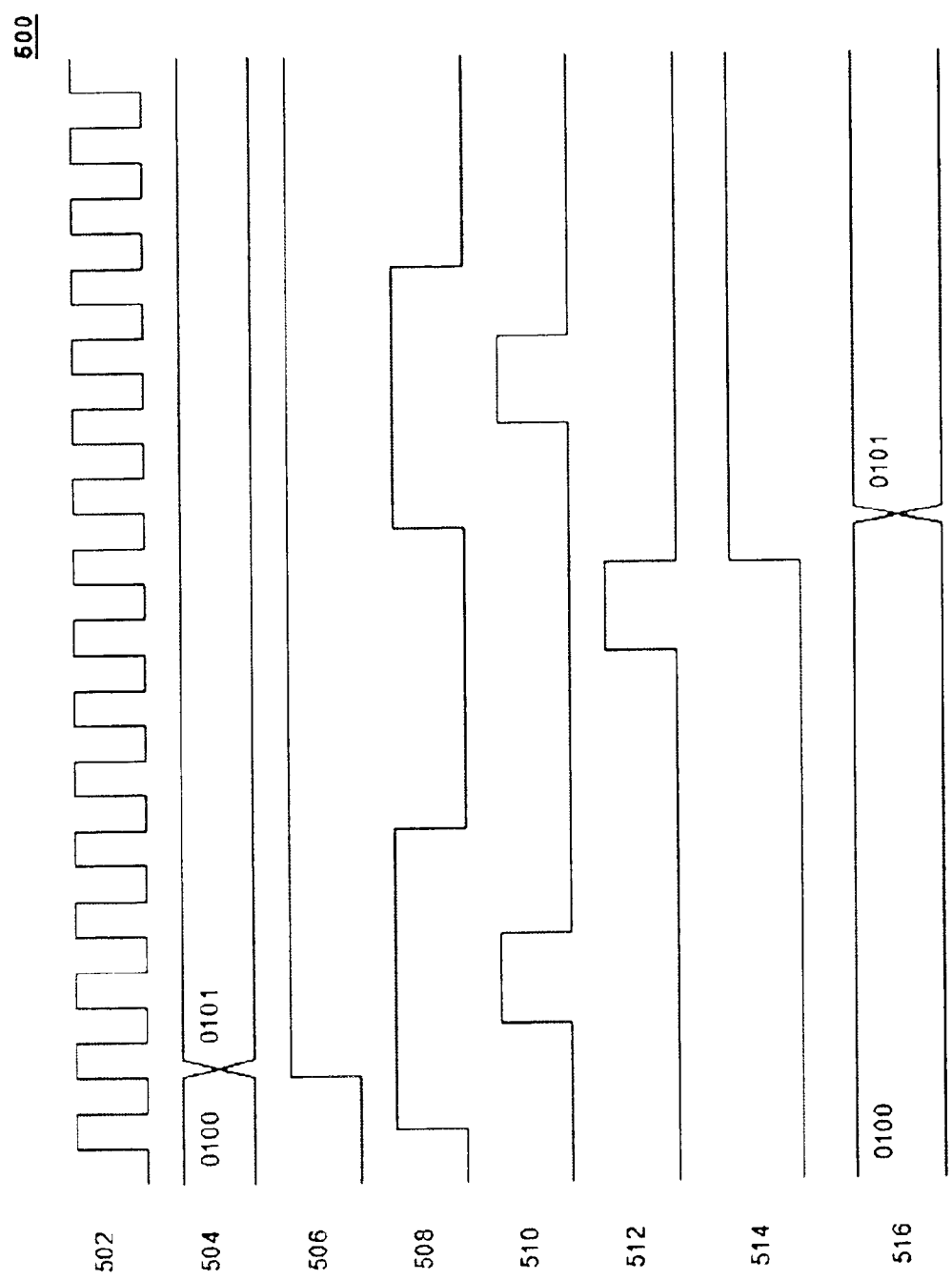
FIG. 5 illustrates a second set of waveform diagrams representing various signals in accordance with one embodiment.

FIG. 5 illustrates a second set of waveform diagrams representing various signals in accordance with one embodiment. FIG. 5 illustrates a set of waveforms 500. Waveform 502 represents the fast clock signal. Waveform 504 represents a 4 bit data bus. As shown in FIG. 5, waveform 504 changes its value from 0100 to 0101 on the rise of the fast clock signal of waveform 502. Waveform 506 represents the signal DATA_VALID that indicates the availability of new valid data on the data bus. Waveform 506 changes its value on the rise of the fast clock signal of waveform 502. Every rise of the DATA_VALID signal (e.g., from 0 to 1) indicates new data ready for transfer on the 4 bit data bus that must be latched by a synchronic element clocked by the slow clock signal represented by waveform 508. For this example, the fast clock signal may have a cycle of 1 ns, while the slow clock signal may have a cycle of 8.5 ns. The waveforms 504 and 506 both change their value on the rise of the fast clock signal.

Waveform 510 represents the SLW_CLK_RISE signal from ratio circuit 202, for example. Waveform 512 represents the LATCH_READY signal from window circuit 204, for example. The synchronized version of the DATA_VALID signal is the DATA_VALID_SYNC signal. Waveform 514 represents the DATA_VALID_SYNC signal. Waveform 514 changes value approximately 0.7 cycle of the fast clock signal before the rise of the slow clock signal. This allows the synchronic element clocked by the slow clock signal sufficient time (e.g., set up time) to realize there is new valid data on the 4 bit data bus, and read the new value at the next rise of the slow clock signal. Waveform 516 represents the output of the synchronic element clocked by the slow clock signal that latched the data from the 4 bit data bus.

Figure 6:
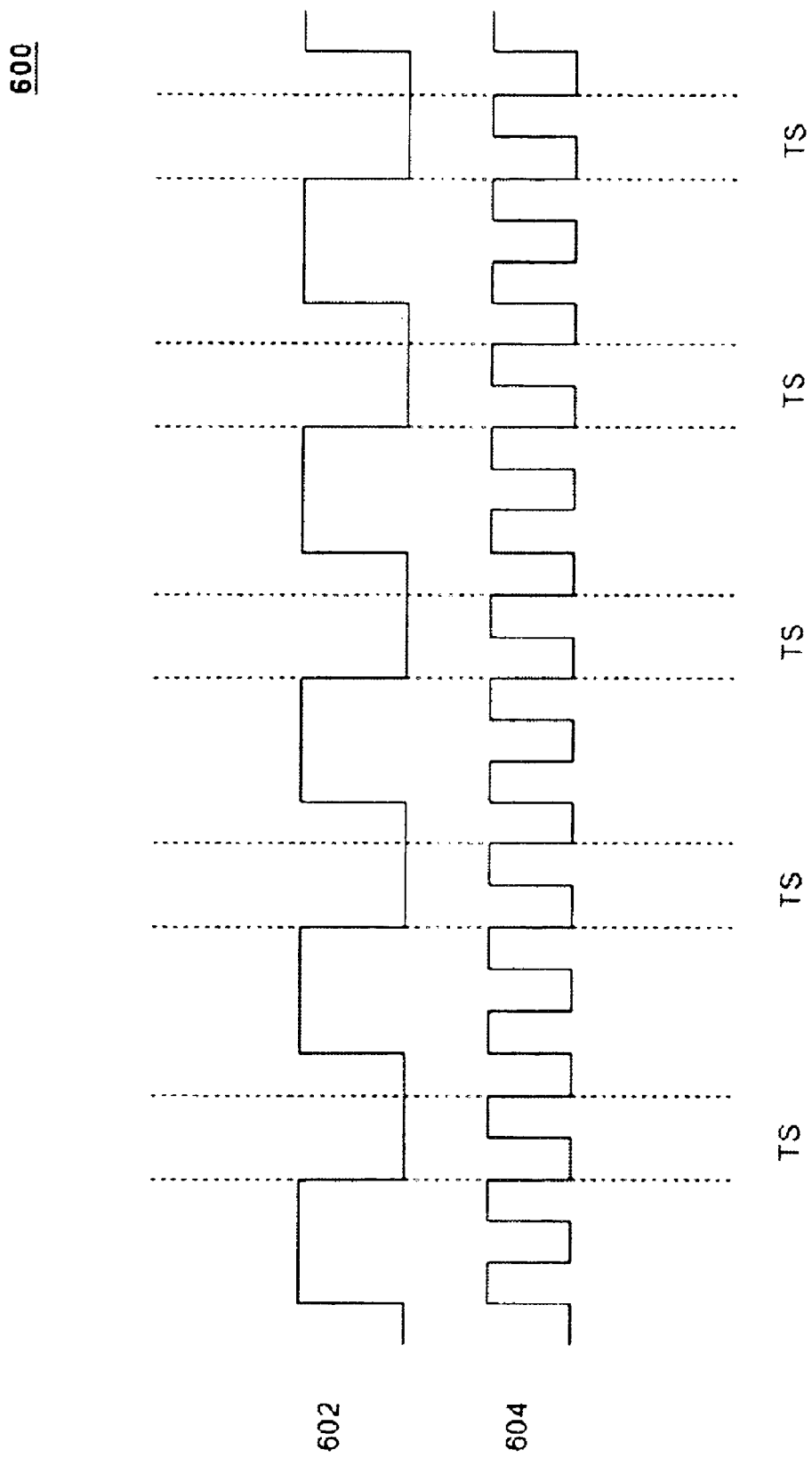
FIG. 6 illustrates a waveform diagram of a time slot for a fast clock signal and a slow clock signal in accordance with one embodiment.

FIG. 6 illustrates a waveform diagram of a time slot (TS) for a fast clock signal and a slow clock signal in accordance with one embodiment. FIG. 6 illustrates a waveform diagram 600. Waveform diagram 600 may comprise a waveform 602 and a waveform 604. Waveform 602 represents a waveform for a slow clock signal. Waveform 604 represents a waveform for a fast clock signal. As shown in FIG. 6, a time slot comprising a time interval of at least one fast clock cycle. The time slot may have a starting time after the falling edge of the slow clock signal, and an end time before the set up time of the element clocked by the slow clock signal. During the time interval defined by the time slot, one or more DATA_VALID signals may be synchronized from the fast clock signal to the slow clock signal. The time interval of the time slot ensures that the synchronic element clocked by the slow clock signal has sufficient time (set up time plus hold time) to read the data from the synchronic element clocked by the fast clock signal.

An example of a synchronization circuit such as synchronization circuit 200 may be further illustrated below. It may be appreciated that a person of ordinary skill in the art may synthesize the underlying structure for synchronization circuit 200 in accordance with the following Verilog code:

```
module fast_synch (reset, clk_slow, clk_fast, data_in, data_out);
  input    clk_slow, clk_fast;
  input    data_in;
  input    reset; // active low reset
  output data_out;
  wire    clk_slow, clk_fast;
  wire    data_in, reset;
  reg     data_out;
  reg     test1, test2;
  reg     clk_slow_d1, clk_slow_d2, clk_slow_d3, clk_slow_rise, clk_slow_rise_d1, clk_slow_rise_d2;
  reg [3:0] count ; // counts clock ratio of clk_slow & clk_fast
  reg [3:0] clk_ratio; // Holds clock ratio value of clk_slow & clk_fast
  reg     synch_no_good; // Error: clk ratio is too low.
  reg     latch_now; // = 1 at end of time window that data_out can change its value.
  reg [1:0] waited_two_clk_slow;// Count first two clk_slow cycles
always @( posedge clk_fast)
  if (~reset)
    data_out <= #1 1'b0;
  else
    if (latch_now) // most late period to latch the data
      data_out <= #1 data_in;
  always @(count[3:0] or clk_ratio[3:0])
    latch_now <= (count[3:0] == (clk_ratio[3:0] - 4'h3) ) ;
// Calculation should result in the latest window possible.
// The value 4'h3 may be changed to fixed or programmable
// value to control the start time of the latching window.
  always @( posedge clk_slow)
    data_in_d1 <= #1 data_in;
  always @(clk_slow or clk_fast )
    test1 <= clk_slow & clk_fast;
  always @(posedge clk_fast)
    test2 <= #1 data_in;
  always @(posedge clk_fast)
    clk_slow_d1 <= #1 clk_slow;
  always @(posedge clk_fast)
    clk_slow_d2 <= #1 clk_slow_d1;
  always @(posedge clk_fast)
    clk_slow_d3 <= #1 clk_slow_d2;
  always @(clk_slow_d2 or clk_slow_d3 )
    clk_slow_rise <= ~clk_slow_d3 & clk_slow_d2;
   always @(posedge clk_slow or reset) // Count first two clk_slow cycles, ignore clock ratio at first two slow clock cycles.
  if (~reset)
    waited_two_clk_slow[1:0] <= 2'b00;
  else
    if (waited_two_clk_slow[1:0] != 2'b10)
      waited_two_clk_slow[1:0] <= waited_two_clk_slow[1:0] + 2'b01 ;
    always @(posedge clk_fast)
        clk_slow_rise_d1 <= #1 clk_slow_rise ;
     always @(posedge clk_fast)
        clk_slow_rise_d2 <= #1 clk_slow_rise_d1 ;
  always @( posedge clk_fast )
    if (~reset | clk_slow_rise)
      count[3:0] <= #1 4'b0000;
    else
      count[3:0] <= #1 count[3:0] + 4'b0001;
  always @( posedge clk_fast ) // Update clk_ratio if it became lower.
    if (~reset)
      clk_ratio[3:0] <= #1 4'b1111;
    else
      if (clk_slow_rise & (waited_two_clk_slow[1:0] == 2'b10) & (clk_ratio[3:0] > count[3:0]))
        clk_ratio[3:0] <= #1 count[3:0];
endmodule // fast_synch
```

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments of the invention.

What is claimed is:

1. A circuit, comprising:

a first logic circuit to operate in a first clock domain, said first logic circuit to generate a control signal;

a second logic circuit to operate in a second clock domain, said second logic circuit to receive said control signal; and a synchronization circuit to synchronize said control signal between said first clock domain and said second clock domain using a time slot determined prior to receiving said control signal at said synchronization circuit.

2. The circuit of claim 1, wherein said first and second logic circuits are synchronous sequential logic circuits.

3. The circuit of claim 1, wherein said control signal is an asynchronous control signal between said first logic circuit and said second logic circuit.

4. The circuit of claim 1, wherein said first clock domain uses a first clock signal operating a first frequency, and said second clock domain uses a second clock signal operating at a second frequency.

5. The circuit of claim 4, wherein said first frequency is higher than said second frequency.

6. The circuit of claim 4, wherein said synchronization circuit synchronizes said control signal from said first clock signal to said second clock signal in zero to one clock cycle of said second clock signal.

7. The circuit of claim 4, wherein said synchronization circuit comprises:
  a ratio circuit to receive said first clock signal and said second clock signal, said ratio circuit to synchronize said first clock signal and said second clock signal in accordance with a synchronization delay value, generate a clock ratio value to represent a clock ratio between said first clock signal and said second clock signal, and generate a rising edge indicator to indicate a rising edge for said second clock signal;
  a window circuit to receive said first clock signal, said second clock signal, said clock ratio value and said rising edge indicator, said window circuit to determine said time slot, and generate a latch ready signal to represent a start time for said time slot; and
  a latch to receive said latch ready signal, said first clock signal, and said control signal, said latch to synchronize said control signal to said second clock signal during said time slot indicated by said latch ready signal, and generate a synchronized control signal.

8. The circuit of claim 7, wherein said latch comprises a D flip-flop.

9. The circuit of claim 7, wherein said latch ready signal is asserted to indicate a start time for said time slot, and remains asserted for a time interval of at least one cycle of said first clock signal.

10. The circuit of claim 9, wherein said start time comprises at least one clock cycle of said first clock signal prior to a set up time for said second logic circuit clocked by said second clock signal.

11. The circuit of claim 1, wherein said first logic circuit comprises a source register to store data, and said second logic circuit comprises a destination register to receive said stored data, and said source registers sends said stored data to said destination register once said control signal has been synchronized.

12. A method, comprising:
  generating a control signal from a first logic circuit operating in a first clock domain;
  sending said control signal to a second logic circuit operating in a second clock domain; and
  synchronizing said control signal from said first clock domain to said second clock domain using a predetermined time slot.

13. The method of claim 12, wherein said first clock domain uses a first clock signal operating at a first frequency, and said second clock domain uses a second clock signal operating at a second frequency.

14. The method of claim 13, wherein said first frequency is higher than said second frequency.

15. The method of claim 14, wherein said synchronization comprises:
  receiving said first and second clock signals at a synchronization circuit;
  synchronizing said first and second clock signals in accordance with a synchronization delay value;
  determining a clock ratio value between said first and second clock signals;
  generating a rising edge indicator for said second clock signal; and
  determining said time slot using first and second clock signals, said clock ratio value, said rising edge indicator and said synchronization delay value.

16. The method of claim 15, further comprising generating a latch ready signal during said time slot.

17. The method of claim 16, wherein said latch ready signal is asserted to indicate a start time for said time slot, and remains asserted for a time interval of at least one cycle of said first clock signal.

18. The method of claim 17, wherein said start time comprises at least one clock cycle of said first clock signal prior to a set up time for said second logic circuit clocked by said second clock signal.

19. The method of claim 12, further comprising transferring said information from said first logic circuit to said second logic circuit once said control signal has been synchronized.

20. A system, comprising:
  a communication medium;
  a network node connected to said communication medium; and
  wherein said network node comprises a plurality of logic circuits, with a first logic circuit to operate in a first clock domain and generate a control signal, a second logic circuit to operate in a second clock domain and receive said control signal, and a synchronization circuit to synchronize said control signal between said first clock domain and said second clock domain using a time slot determined prior to receiving said control signal at said synchronization circuit.

21. The system of claim 20, wherein said first clock domain uses a first clock signal operating a first frequency, said second clock domain uses a second clock signal operating at a second frequency, and said first frequency is higher than said second frequency.

22. The system of claim 21, wherein said synchronization circuit comprises:
  a ratio circuit to receive said first clock signal and said second clock signal, said ratio circuit to synchronize said first clock signal and said second clock signal in accordance with a synchronization delay value, generate a clock ratio value to represent a clock ratio between said first clock signal and said second clock signal, and generate a rising edge indicator to indicate a rising edge for said second clock signal;
  a window circuit to receive said first clock signal, said second clock signal, said clock ratio value and said rising edge indicator, said window circuit to determine said time slot, and generate a latch ready signal to represent a start time for said time slot; and
  a latch to receive said latch ready signal, said first clock signal, and said control signal, said latch to synchronize said control signal to said second clock signal during said time slot indicated by said latch ready signal, and generate a synchronized control signal.

* * * * *